United States Patent [19]
Jungkman et al.

[11] Patent Number: 4,812,655
[45] Date of Patent: Mar. 14, 1989

[54] PRISM COLD SHIELD

[75] Inventors: David L. Jungkman, Hudson; James W. Howard, Natick; Timothy E. White, Acton, all of Mass.

[73] Assignee: Honeywell Inc., Minneapolis, Minn.

[21] Appl. No.: 130,699

[22] Filed: Dec. 9, 1987

[51] Int. Cl.$^4$ ................................................ G01J 5/06
[52] U.S. Cl. .................................. 250/352; 250/332; 250/349
[58] Field of Search .................... 250/352, 505.1, 349, 250/332

[56] References Cited
U.S. PATENT DOCUMENTS 3,963,926 6/1976 Borrello .............................. 250/332
4,431,918 2/1984 White ................................ 250/352

*Primary Examiner*—Carolyn E. Fields
*Attorney, Agent, or Firm*—Haugen and Nikolai

[57] ABSTRACT

A prism cold shield adaptable to an infrared detector system comprising a prism-shaped substrate having an upper portion partially coated with opaque material and a lower portion partially coated with opaque material wherein windows formed by the upper and lower coatings defined the field of view for a plurality of infrared detectors thereby cold shielding the detectors in the linear direction of the detector array.

4 Claims, 1 Drawing Sheet

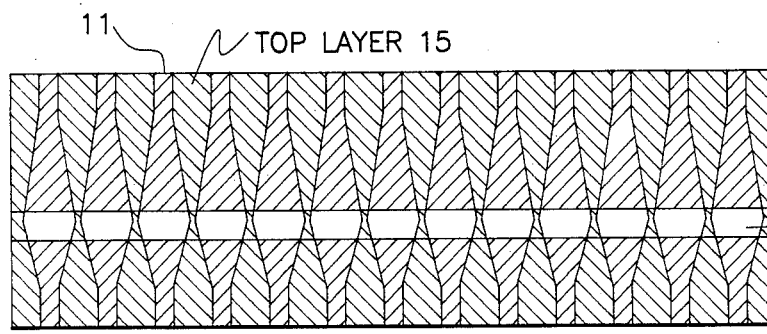
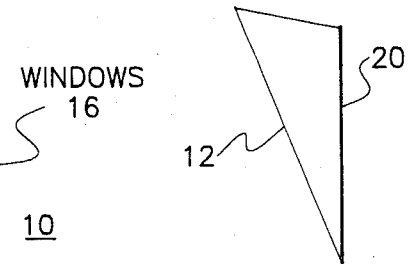
Fig. 1a
Fig. 1c
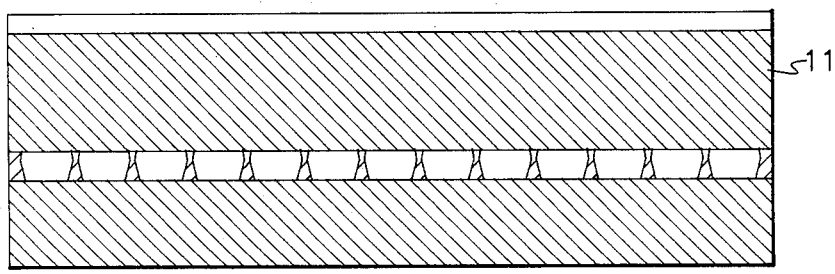
Fig. 1b
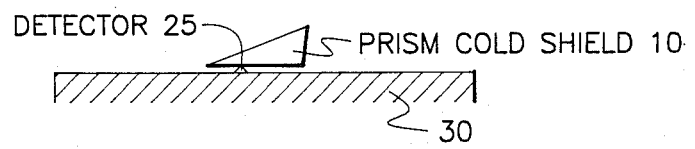
Fig. 2

PRISM COLD SHIELD

The United States Government has acquired certain rights in this invention pursuant to Government Contract No. DAAK70-82-C-0237.

FIELD OF THE INVENTION

This invention relates to cold shields used in infrared devices and, more particularly, to cold shields as used in Forward Looking Infrared Devices (hereinafter called "FLIRS").

BACKGROUND OF THE INVENTION

The invention is directed to infrared systems. Infrared detectors as used in current infrared systems, such as FLIRS, are presented with two types of radiation: 1. radiation of interest and 2. background noise. In general, a cold shield is a blocker which blocks background radiation to allow the infrared detector being shielded a better background for detecting radiation of interest. The effectiveness of a cold shield is dependent on its geometry and position with respect to the detectors. As a general rule, the cold shield should be placed as far in front of the detector as possible. However, this results in complicating and enlarging the structure of such infrared devices because the cold shield itself must be cooled to the temperature of the detector to reduce unwanted radiation from the cold shield itself. This is usually done by mounting the cold shield and detectors together in the same container. The present invention solves the structural dilemma presented above in providing a prism cold shield which is highly effective and yet allows for a compact structure in an infrared device.

BRIEF DESCRIPTION OF THE DRAWING

FIG. 1a, 1b, and 1c are a schematic view of the cold shield of the present invention showing top, bottom, and side views, respectively.

FIG. 2 is a schematic view of the cold shield of the present invention showing the prism cold shield of the invention mounted over a detector substrate.

SUMMARY OF THE INVENTION

A prism cold shield adaptable to an infrared detector is disclosed comprising a prism-shaped substrate. The prism cold shield has an upper portion partially coated with a first film opaque to the radiation of interest and a lower portion partially coated with a second such opaque film wherein windows formed by the deposited films define the field of view (hereinafter called FOV) for a plurality of infrared detectors thereby cold shielding the detectors in the linear direction of the detector array.

DETAILED DESCRIPTION OF THE PREFERRED EMBODIMENT

Referring now to FIG. 1, the cold shield of the present invention is shown schematically in top view, bottom view, and side view. The prism may preferably be manufactured in the shape of a wedge or other suitable prismatic shape. A first opaque film layer 15 is deposited on the upper surface 12 of the prism 10 such that a plurality of windows 16 are left uncoated on the upper surface 12. A second opaque film layer 11 is deposited on the bottom surface 20 of the prism 10 such that, in combination with the first layer 15, the windows in the upper and lower surfaces define the FOV for a plurality of infrared detectors 25 (shown in FIG. 2).

The prism cold shield may be comprised of zinc sulfide or other low index optical materials as determined by the optical prescription of the system it is used in. The opaque film layers may be comprised a combination of metals and dark mirror coatings or solely comprised of metals or be solely comprised of dark mirror coatings. In one embodiment of the present invention, dark mirror coatings may be used outside of the detector viewing area and anti-reflective coatings may be used within the detector viewing area. Such anti-reflective coatings are well known in the art and may be multilayered or single layers.

Referring now to FIG. 2, a prism cold shield 10 is shown mounted by conventional mounting means over a plurality of infrared detectors 25, which are, in turn, carried on a detector substrate 30. Such detectors are well known and may preferably be comprised of cadmium mercury telluride material. The detectors 25 are suitably positioned such that the windows 16 define the FOV for the detectors.

In one embodiment of the invention, the prism 10 is mounted about 0.001 inches above the detector array. Typically, the prism may be mounted on support posts (not shown) located off the end of the detector array. Such support posts are usually manufactured as an integral part of the detector array.

While there has been shown and described a preferred embodiment of the invention, those skilled in the art will appreciate that various changes and modifications may be made to the illustrated embodiment without departing from the true spirit and scope of the invention which is to be determined from the appended claims.

The embodiments of the invention in which an exclusive property or right is claimed are defined as follows:

1. A prism cold shield for an infrared detector system comprising a prism-shaped substrate having an upper portion partially coated with a first film opaque to the radiation of interest and a lower portion partially coated with a second film opaque to the radiation of interest wherein windows formed by the first and second films acting in combination define a field of view for a plurality of infrared detectors in an array so as to cold shield the detectors in the linear direction of the detector array.

2. The device of claim 1 wherein the prism cold shield is in the shape of a wedge.

3. The device of claim 1 wherein said first film and said second film comprise dark mirror coating materials and anti-reflective coatings.

4. The device of claim 1 wherein the material of the substrate is zinc sulfide.

* * * * *